US009802357B2

(12) United States Patent
Lolli

(10) Patent No.: US 9,802,357 B2
(45) Date of Patent: Oct. 31, 2017

(54) TRANSFERRING ASSEMBLY FOR TRANSFERRING A RADIOFREQUENCY IDENTIFICATION DEVICE ONTO AN OBJECT

(71) Applicant: Smart Res Societa' per Azioni, Spilamberto (IT)

(72) Inventor: Marcello Lolli, Castelnuovo Rangone (IT)

(73) Assignee: Smart Res Societa' per Azioni (IT)

( * ) Notice: Subject to any disclaimer, the term of this patent is extended or adjusted under 35 U.S.C. 154(b) by 195 days.

(21) Appl. No.: 14/885,079

(22) Filed: Oct. 16, 2015

(65) Prior Publication Data

US 2016/0129629 A1 May 12, 2016

Related U.S. Application Data

(63) Continuation of application No. 13/120,503, filed as application No. PCT/IB2009/054194 on Sep. 25, 2009, now Pat. No. 9,196,961.

(30) Foreign Application Priority Data

Sep. 25, 2008 (IT) .............................. MO2008A0247

(51) Int. Cl.
*B29C 65/48* (2006.01)
*G06K 19/077* (2006.01)
*B32B 7/12* (2006.01)
*H01Q 7/00* (2006.01)
(Continued)

(52) U.S. Cl.
CPC .... *B29C 65/4815* (2013.01); *G06K 19/07718* (2013.01); *H01Q 7/00* (2013.01); *B29L 2031/34* (2013.01); *B32B 7/12* (2013.01);

*H05K 3/20* (2013.01); *H05K 2201/10287* (2013.01); *Y10T 156/1089* (2015.01)

(58) Field of Classification Search
CPC ... B29C 65/4815; B29L 2031/34; B32B 7/12; Y10T 156/1089; H05K 2201/10287; H05K 3/20; H01Q 7/00; G06K 19/07718
USPC ......... 156/247; D10/106.9; 340/568.1–572.9
See application file for complete search history.

(56) References Cited

U.S. PATENT DOCUMENTS

| | | |
|---|---|---|
| 2002/0060903 A1 | 5/2002 | Kano et al. |
| 2003/0061947 A1 | 4/2003 | Hohberger et al. |
| 2004/0094949 A1 | 5/2004 | Savagian et al. |

(Continued)

FOREIGN PATENT DOCUMENTS

EP        1195715 A2        10/2002

*Primary Examiner* — Sonya Mazumdar
(74) *Attorney, Agent, or Firm* — Laubscher, Spendlove & Laubscher, P.C.

(57) ABSTRACT

A transferring assembly for transferring onto an object a RFID identification device consisting of a microchip connected to an antenna made of electrically conductive material, wherein a film of adhesive material is applied to a supporting element, the microchip is applied on the film of adhesive material in a zone of the supporting element, the antenna is formed by applying the wire made of electrically conductive material to the film of adhesive material and electrically connecting the antenna to the microchip, and the zone is pressed against a surface of the object, with the RFID identification device facing the surface, the adhesive material, and/or the supporting element, being chosen so that the adhesive material has an adhesiveness on the surface of the object that is significantly greater than the adhesiveness of the film on the supporting element.

10 Claims, 3 Drawing Sheets

(51) Int. Cl.
 *H05K 3/20* (2006.01)
 *B29L 31/34* (2006.01)

(56) References Cited

U.S. PATENT DOCUMENTS

| | | |
|---|---|---|
| 2006/0081333 A1 | 4/2006 | Hohberger et al. |
| 2006/0213609 A1 | 9/2006 | Green et al. |
| 2007/0035466 A1 | 2/2007 | Coleman et al. |
| 2007/0084548 A1 | 4/2007 | Tanaka |
| 2007/0181253 A1 | 8/2007 | Xu et al. |
| 2010/0018640 A1 | 1/2010 | Simons |

TRANSFERRING ASSEMBLY FOR TRANSFERRING A RADIOFREQUENCY IDENTIFICATION DEVICE ONTO AN OBJECT

This application is continuation of application Ser. No. 13/120,503 filed Mar. 23, 2011 which was a national phase of PCT International Application No. PCT/IB2009/054194 filed Sep. 25, 2009. PCT/IB2009/054194 claims priority to IT Application No. MO2008A000247 filed Sep. 25, 2008. The entire contents of these applications are incorporated herein by reference.

BACKGROUND OF THE INVENTION

The present invention relates to a transferring assembly for transferring a radiofrequency identification device, or RFID device, onto an object.

Radiofrequency identification devices consist of a microchip connected to an antenna made of a conductive material.

The antenna made of a conductive material is mainly made according to three techniques.

BRIEF DESCRIPTION OF THE PRIOR ART

A first technique provides for printing the antenna on a supporting element, using a conductive, for example silver-based ink.

This technique has been found to be unsuitable in the case of RFID devices to be applied to various types of objects, in particular to labels for items of clothing.

A second technique provides for making the antenna by chemical etching of an electrically conductive metal sheet, for example copper or aluminium, coupled with a film made of plastics, generally a polyester film.

The RFID devices that are made using this second technique have the drawback that, when they are applied to the surface of a thin and flexible object, such as, for example, objects made of paper, or labels for items of clothing, make such objects too thick and stiff, which, for example in the case of label, can be irritating for a person wearing an item of clothing with said label, further it could damage the item of clothing following repeated washing and ironing cycles. Also in the case of application to stiff objects, RFID devices made according to said second technique form a clear ridge on the surface of the object, which may be aesthetically displeasing.

A third technique provides for forming the antenna made of electrically conductive wire by applying or incorporating, as disclosed, for example in U.S. Pat. No. 6,233,818 and EP 0 880 754, to a film of plastics or paper. With these known techniques the radiofrequency identification device always forms an assembly that is not dissociable with the film of plastics or paper and thus said film is always inserted or applied to the final object with the same drawbacks or contraindications already disclosed for the antennas made of etched metal.

SUMMARY OF THE INVENTION

The present invention aims to provide a transferring assembly and a method for transferring a radiofrequency identification device onto an object without the aforesaid drawbacks occurring and thus without the need for the film of plastics or paper used for manufacturing having to be applied together with the radiofrequency device to the final object.

According to a first aspect of the present invention a transferring assembly is provided for transferring to an object an RFID identification device, the RFID identification device including a microchip connected to an antenna made with a wire of electrically conductive material, wherein it includes a supporting element to which a film or layer of adhesive material is applied, at least a RFID identification device being applied to the film of adhesive material, the adhesive material, and/or the supporting element, being chosen so that the adhesive material has an adhesiveness on a surface of the object that is significantly greater than the adhesiveness of the film on the supporting element.

According to a further aspect of the present invention a method is provided for transferring onto an object a RFID identification device consisting of a microchip connected to an antenna made of electrically conductive material, wherein it comprises applying a film of adhesive material to a supporting element, applying said microchip on said film of adhesive material in a zone of said supporting element, forming said antenna by applying said wire made of electrically conductive material to said film of adhesive material and electrically connecting said antenna to said microchip, heating said supporting element in said zone and pressing said zone against the surface of said object, with the RFID device facing said surface, said adhesive material, and/or said supporting element, being chosen so that said adhesive material has an adhesiveness on said surface that is significantly greater than the adhesiveness of said film on said supporting element.

Owing to the invention, the RFID device can be applied very simply and rapidly to the surface of an object, for example to a label of an item of clothing, or to the item of clothing, heating the supporting element in the zone to which the RFID device is applied and pressing the film of adhesive thermoplastic to the surface of the object so as to transfer the RFID device with the adhesive material to said surface and glue the RFID device to the surface.

The thickness and weight of the RFID device and of the layer of adhesive are very reduced, so the presence of the RFID device on the object is substantially imperceptible, in particular, in the case of a label, the RFID device does not significantly alter the flexibility and the thickness of the label.

Alternatively, the RFID device can be applied directly to the item of clothing, for example below a hem, before it is sewn.

The RFID device according to the invention can further be applied to a surface of any flexible or stiff object.

BRIEF DESCRIPTION OF THE FIGURES

A manner of implementing the invention is illustrated by way of non-limiting example in the set of attached drawings in which.

DETAILED DESCRIPTION

Figure 1:
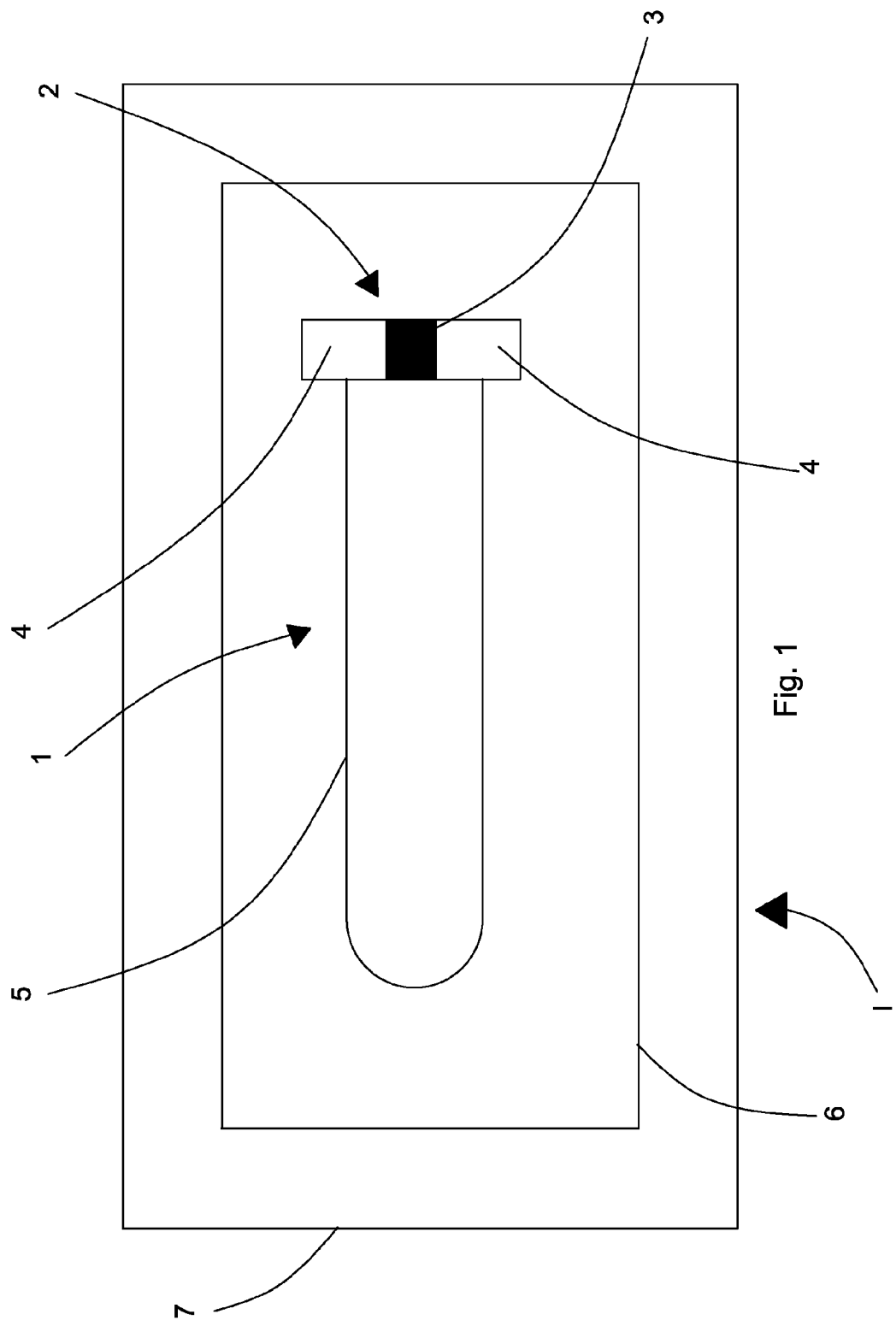
FIG. 1 is a plan view of a transferring assembly according to the invention by means of which it is possible to transfer a RFID device to the surface of an object.

In FIG. 1, there is illustrated a transferring assembly 1 according to the invention that includes a supporting element 7 to which a film 6 of adhesive material is applied, for example a thermoplastic or thermohardening adhesive material.

The film or layer of adhesive material 6 can cover the entire surface of the supporting element 7 or can be applied only to the zones intended for the transfer, for example by means of silkscreen printing.

A RFID device 1, or a plurality of RFID devices 1 distributed on said film 6 is applied to the film 6 of adhesive material.

Each RFID device 1 comprises a modular element 2 including of a microchip 3, connected to contact elements 4 made of electrically conductive material, and an antenna 5 made with a wire made of electrically conductive material connected to the contact elements 4. The antenna 5 can include a single coil, for example circular or substantially rectangular, and the electrically conductive material is copper.

The adhesive material of the film 6, and/or the supporting element 7, are chosen so that the adhesiveness of the adhesive material to the supporting element 7 is noticeably less than the adhesiveness of said adhesive to the surface of an object 8, 16 to which a RFID device 1 is intended to be applied.

The supporting element 7 can be a supporting element made of silicone-coated paper or silicone-coated plastic film.

The RFID device 1 according to the invention is made by placing on the supporting element 7 the film 6 of adhesive material, by applying the modular element 2 on said film 6, forming the antenna 5 on said film 6 and electrically connecting the antenna 5 to the contact elements 4 of the microchip 3.

In order to transfer the RFID device 1 to a label, or directly to an item of clothing 16, or to any object 8, it is sufficient, if the film 6 is made of thermoplastic or thermohardening adhesive material, to heat the support 7 in the zone to which the film 6 of adhesive is applied and press said film 6 lightly on the surface of the label or on a surface of the item of clothing 16, or of an object 8, so as to transfer the film 6 with the RFID device 1 applied thereto to said surface. The transfer occurs owing to the fact that the adhesiveness of the film 6 on the surface of the label, or of the item of clothing, or of the object, is much greater than the adhesiveness of the film 6 to the support 7.

After the transfer has been completed, the thermoplastic adhesive cools and ensures stable gluing of the radiofrequency identification device 1 to the label, or to the item of clothing, or to the object.

If the adhesive material is not a thermoplastic or thermohardening adhesive material, it is sufficient to press the supporting element 7 onto the surface of the object 8 to which the RFID device has to be applied, the transfer occurring owing to the greater adhesiveness of the adhesive material to the surface of the object 8.

If the RFID device 1 according to the invention is applied to an item of clothing, the adhesive material can be of the type used in items of clothing to replace stitches or for applying decorations. This ensures that the adhesive material does not suffer alterations following washing and ironing cycles to which the item of clothing is subjected, to which the label with the RFID device or the RFID device itself is applied. Such alterations could cause the RFID circuit to become detached or could damage the aesthetic appeal of the item of clothing.

Figure 2:
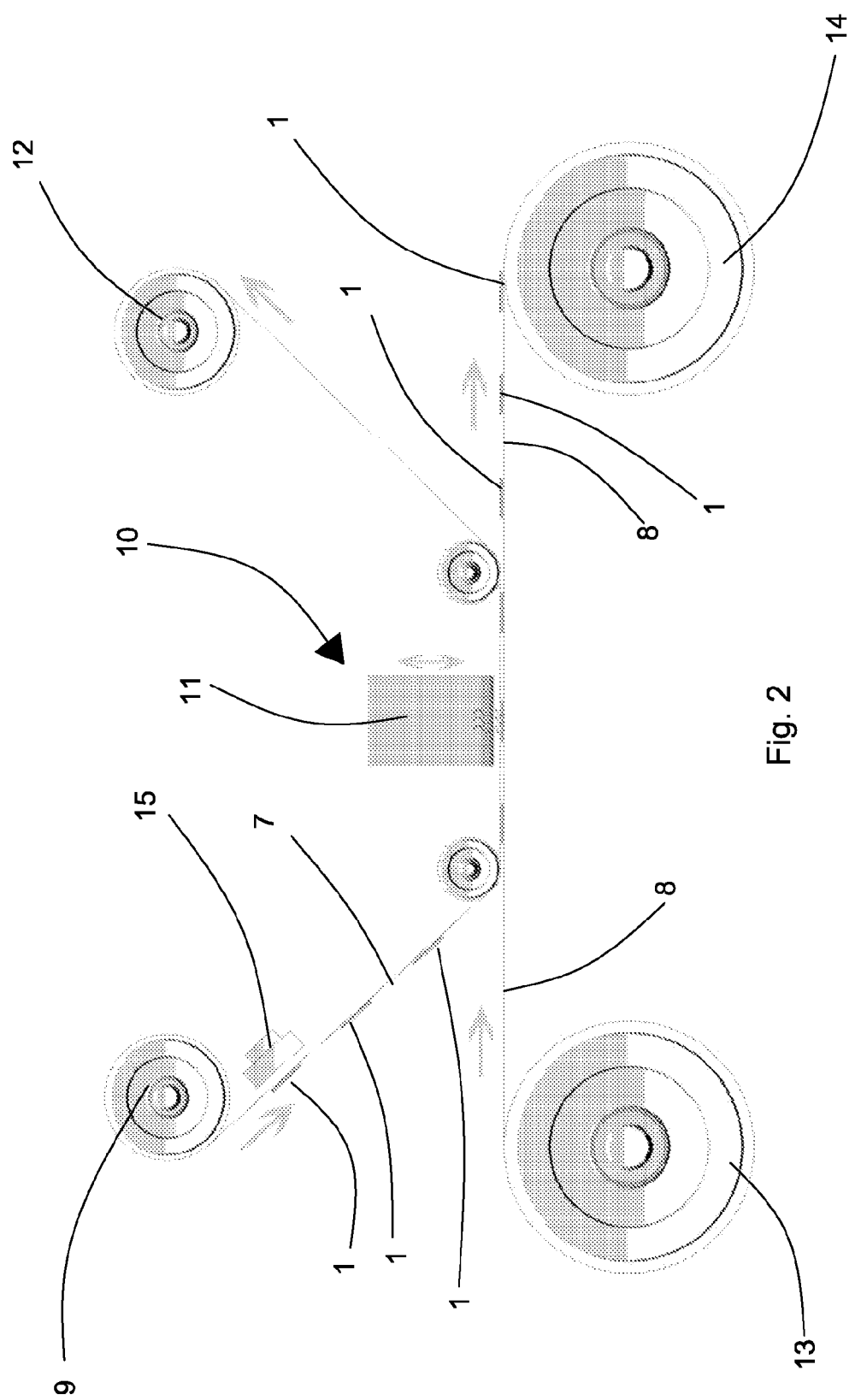
FIGS. 2 and 3 illustrate applying the RFID device to a continuous substrate and to an item of clothing.
Figure 3:
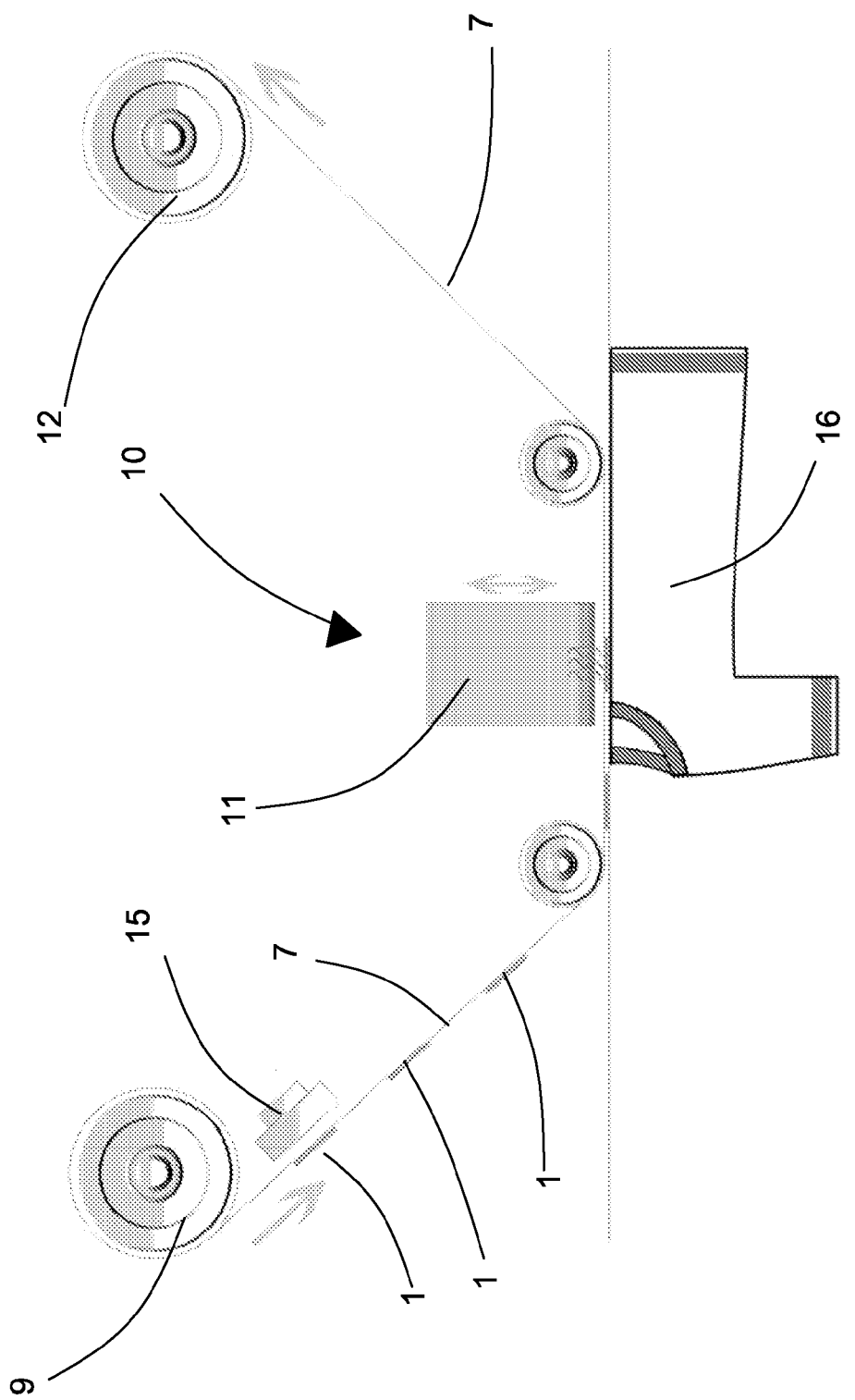

In FIGS. 2 and 3 there are illustrated two examples of transferring the RFID device to the surface of an object, for example to a substrate 8 in the form of a strip (FIG. 2), or to an item of clothing 16 (FIG. 3).

With reference to FIG. 2, a supporting element 7, with a film 6 of adhesive material, for example thermoplastic or thermohardening adhesive material and a plurality of RFID devices applied to the film 6, is unwound from a first reel 9 on which the supporting element 7 was previously wound, and guided to a transferring device 10, such as a heated punch 11. The transferring device 10 is applied to the surface of the supporting element 7 opposite which the film 6 of adhesive and the RFID devices 1 are applied, in a zone at which there is a radiofrequency identification device 1. The transferring device 10 exerts pressure on the zone of the support 7, pressing the zone against the substrate 8, unwound from a second reel 13.

If the adhesive material of the film 6 is a thermoplastic or thermohardening material, the transferring device 10, in addition to exerting a pressure on said zone of the supporting element 7, heats the zone to cause softening, or melting, of the adhesive material.

In this latter case, owing to the pressure and the heating carried out by the transferring device 10, the zone of the film 6 of thermoplastic or thermohardening adhesive to which the RFID device 1 is applied melts and the RFID device 1 is transferred with the adhesive to the substrate 8, owing to the fact that the thermoplastic adhesive is chosen so that the adhesiveness thereof on the surface of the substrate 8 is noticeably greater than the adhesiveness on the support 7. If the adhesive material is not a thermoplastic or thermohardening material the transfer occurs by the mere pressure exerted by the transferring device 10 and the greater adhesiveness of the adhesive material on the surface of the substrate 8.

After applying the RFID devices to the substrate 8, the support 7, which is now devoid of the RFID devices and of the adhesive in the zones that have come into contact with the punch 11 and have been subjected to the pressure thereof, is wound around a third reel 12 and the substrate 8 with the RFID devices 1 applied thereto is wound around a fourth reel 14.

Before applying the RFID devices 1 to the substrate 8, the integrity of each RFID device 1 can be tested by a testing device 15 placed between the first reel 9 and the transferring device 10. If the testing device detects that a RFID device 1 is faulty, the latter is not applied to the substrate 8.

In FIG. 3 there is illustrated the transfer of a RFDI device 1 to an item of clothing 16. The transfer occurs in a manner that is completely analogous to the transfer onto a substrate 8 that has been previously disclosed by pressing onto a surface of the item of clothing 16 via the transferring device 10, a zone of the support 7 at which a RFID device 1 is applied and possibly heating said zone via the transferring device 10.

In the practical embodiment, the material, the dimensions and the constructional details may be different from those indicated but be technically equivalent thereto without thereby falling outside the scope of the present invention, as defined by the claims.

The invention claimed is:

1. A transferring assembly for transferring a RFID identification device onto an object, said RFID identification device comprising a microchip connected to an antenna made with a wire of electrically conductive material, wherein it comprises a supporting element to which a film of adhesive material is applied, at least a RFID identification device being applied on said film of adhesive material in a zone of said supporting element, a transferring device capable of pressing said zone of said supporting element against a surface of an object to cause said film of adhesive material with said RFID identification device to be transferred onto said surface of said object, said adhesive material being chosen so as to have an adhesiveness on a surface of said object that is significantly greater than the adhesiveness of said adhesive material on said supporting element so that said film of adhesive material with said RFID identification device is transferred from said supporting element to the surface of said object when it is pressed on said surface by said transferring device.

2. A transferring assembly according to claim 1, wherein said antenna is electrically connected to a modular element to which said microchip is connected.

3. A transferring assembly according to claim 1, wherein said adhesive material is a thermoplastic or thermohardening adhesive material.

4. A transferring assembly according to claim 3, wherein said transferring device comprises a heated punch.

5. A transferring assembly according to claim 1, wherein said antenna consists of a single coil.

6. A transferring assembly according to claim 5, wherein said single coil has a circular or rectangular shape.

7. A transferring assembly according to claim 1, wherein said adhesive material is an adhesive material for items of clothing.

8. A transferring assembly according to claim 1, wherein said RFID device is applied to a label intended for being fixed to an item of clothing.

9. A transferring assembly according to claim 1, wherein said RFID device is applied directly to a surface of an item of clothing.

10. A transferring assembly according to claim 1, wherein said RFID device is applied directly to a surface of an object.

* * * * *